(12) United States Patent
Cressman

(10) Patent No.: US 8,933,724 B2
(45) Date of Patent: Jan. 13, 2015

(54) STATE TRANSITIONING CLOCK GATING

(71) Applicant: John W. Cressman, Jefferson, MA (US)

(72) Inventor: John W. Cressman, Jefferson, MA (US)

(73) Assignee: Intel Corporation, Santa Clara, CA (US)

( * ) Notice: Subject to any disclaimer, the term of this patent is extended or adjusted under 35 U.S.C. 154(b) by 24 days.

(21) Appl. No.: 13/653,138

(22) Filed: Oct. 16, 2012

(65) Prior Publication Data

US 2013/0069692 A1   Mar. 21, 2013

Related U.S. Application Data

(63) Continuation of application No. 12/769,374, filed on Apr. 28, 2010, now Pat. No. 8,289,048.

(51) Int. Cl.

| | |
|---|---|
| G06F 7/38 | (2006.01) |
| H03K 19/177 | (2006.01) |
| H03K 17/16 | (2006.01) |
| H03K 19/003 | (2006.01) |
| H03K 3/00 | (2006.01) |
| H03K 19/00 | (2006.01) |
| G06F 1/32 | (2006.01) |

(52) U.S. Cl.
CPC .......... *H03K 19/0016* (2013.01); *G06F 1/3237* (2013.01); *G06F 1/3287* (2013.01)
USPC .................................. 326/46; 326/28; 326/40

(58) Field of Classification Search
CPC ........... G05B 19/045; G06F 7/00; G06F 1/10; G06F 1/04; G06F 9/223; H03K 3/037; H03K 19/1736; H03K 19/0963; H03K 5/13
USPC .............................. 326/46, 54, 40, 28, 93, 95; 327/201–218, 185, 291; 712/232
See application file for complete search history.

(56) References Cited

U.S. PATENT DOCUMENTS

| | | | | |
|---|---|---|---|---|
| 5,289,518 | A | * | 2/1994 | Nakao ............................. 377/81 |
| 5,498,988 | A | * | 3/1996 | Reyes et al. ................... 327/199 |
| 5,799,048 | A | | 8/1998 | Farjad-Rad et al. |

(Continued)

OTHER PUBLICATIONS

Non-Final Office Action mailed Nov. 21, 2011 for U.S. Appl. No. 12/769,374.

(Continued)

*Primary Examiner* — Dylan White
(74) *Attorney, Agent, or Firm* — Blakely, Sokoloff, Taylor & Zafman LLP

(57) ABSTRACT

An integrated circuit (IC) is described. The IC includes a clock distribution network for distributing a clock signal. The IC includes a first sequential circuit having a clock input to receive the clock signal to generate an output. The output of the first sequential circuit is coupled to an input of a first logic group comprising combinatorial logic circuitry. The IC also includes first circuitry to compare logic states of the input and the output and to inhibit the clock signal from propagating to the clock input if the logic states are the same. The IC also includes a second sequential circuit having a second clock input to receive the clock signal to generate a second output. The second output of the second sequential circuit is coupled to an input of a second logic group comprising combinatorial logic circuitry. The IC also includes second circuitry to compare logic states of the input and the output of the second sequential circuit and to inhibit the clock signal from propagating to the second sequential circuit if the logic states are the same.

16 Claims, 3 Drawing Sheets

(56) References Cited

U.S. PATENT DOCUMENTS

| | | | |
|---|---|---|---|
| 5,989,695 A | 11/1999 | Fuller et al. | |
| 6,630,853 B1 * | 10/2003 | Hamada | 327/202 |
| 6,700,944 B1 * | 3/2004 | Chlipala et al. | 375/376 |
| 6,879,185 B2 | 4/2005 | Swami et al. | |
| 6,989,695 B2 * | 1/2006 | Dike et al. | 327/142 |
| 7,023,240 B2 * | 4/2006 | Elappuparackal | 326/40 |
| 7,420,391 B2 * | 9/2008 | Pesci | 326/46 |
| 7,576,582 B2 | 8/2009 | Lee | |
| 7,772,905 B2 * | 8/2010 | Yasuda et al. | 327/202 |
| 8,030,963 B2 * | 10/2011 | Ferchland et al. | 326/52 |
| 8,040,155 B2 * | 10/2011 | Tran Vo et al. | 326/93 |
| 8,289,048 B2 * | 10/2012 | Cressman | 326/46 |
| 8,384,437 B2 * | 2/2013 | Sofer et al. | 326/93 |
| 2004/0246810 A1 | 12/2004 | Dike et al. | |
| 2005/0285210 A1 | 12/2005 | Ishibashi et al. | |
| 2009/0002032 A1 * | 1/2009 | Srivastava et al. | 326/93 |
| 2010/0316387 A1 | 12/2010 | Suvakovic | |

OTHER PUBLICATIONS

Final Office Action mailed Apr. 23, 2012 for U.S. Appl. No. 12/769,374.

Notice of Allowance mailed Jun. 13, 2012 for U.S. Appl. No. 12/769,374.

* cited by examiner

STATE TRANSITIONING CLOCK GATING

CLAIM OF PRIORITY

The present application is a Continuation of, and claims priority to and incorporates by reference in its entirety, the corresponding U.S. patent application Ser. No. 12/769,374 filed Apr. 28, 2010, and entitled "STATE TRANSITIONING CLOCK GATING," and issued as U.S. Pat. No. 8,289,048 on Oct. 16, 2012.

TECHNICAL FIELD

Some embodiments relate generally to clock gating and in particular, to methods and circuits directed to clock gating based on state transitioning.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

In some embodiments, new clock gating approaches, referred hereafter as State Transition Gating (STG) methods and circuits are provided. In areas of circuit designs including sequential elements with increased clock loading, the use of STG may be used to reduce dynamic power consumption. With clock distribution networks, increased loading generally results in a higher overall switching capacitance and thus, increased dynamic power is required for driving it. Using STG to minimize the clock network activity in these areas has the potential to generate power savings.

Among other things, STG can allow clock signals for groups (or clusters) of sequential elements to be dynamically gated, in real-time, when their associated data to be clocked is not going to change (their output is not going to transition). This can reduce the dynamic power dissipated within functional unit blocks containing the STG circuitry. In some embodiments, the local clock networks, utilized by groups of sequential elements, are disabled based on a determination that the data to be stored in a given clock cycle does not differ from the previous cycle. Thus, power reduction is attained, over time, by dynamically shutting off, and turning back on, portions of local clock distribution networks during cycles when next state data for groups of sequential elements is the same as the currently stored state for each member of the group.

STG solutions may be contrasted with conventional solutions, which generally implement functional gating (FG, whereby clocks for whole blocks or domains are gated off, e.g., when a domain is changed to a less active state. That is, with functional gating, all circuitry corresponding to the particular function being gated is enabled or disabled together, depending on if the functionality is needed by an application during that time. With the use of STG, however, finer granularity in power management can be attained, allowing multiple sub groups of the functionality to be disabled even when the overall function is enabled within the FG context. The STG system can continuously check for unchanged data and enable the local clock network, on demand, to individual groups of sequential elements.

Figure 1:
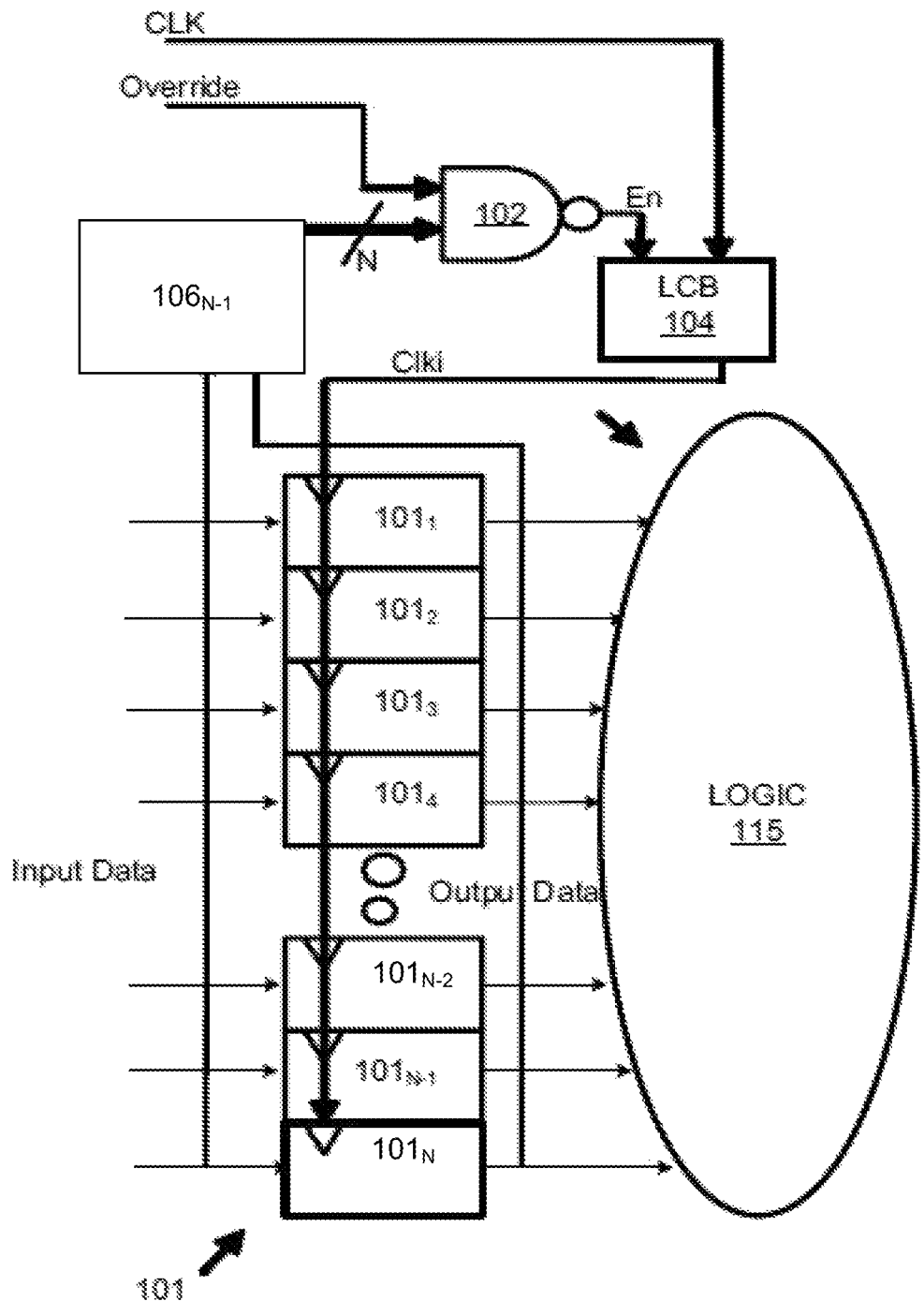
FIG. 1 is a schematic diagram of a logic circuit with state transition gating in accordance with some embodiments.

FIG. 1 shows an STG implementation, in accordance with some embodiments, for gating a cluster 101 of sequential circuits $101_i$, such as master/slave flip-flop circuits, latches, or the like. The sequential circuits $101_i$ may correspond to any sequential circuit for clocking input data into output data to logic 115 using a common clock signal such as Clki. Logic 115 may correspond to any circuitry such as registers, combinational logic, pipeline elements, memory cells, etc.

The STG circuitry for servicing the depicted sequential cluster comprises a gate (NAND) 102, local clock buffer (LCB) 104, and multiple '$N_1$', (one for each sequential $101_i$) XNOR gates 106, all coupled together as shown. An XNOR gate is associated with each sequential to generate an output that is the logical "XNOR" result of the input and output for its associated sequential. The XNOR outputs for all of the sequentials in the cluster, along with an override signal, are fed into the multiple input (N+1) NAND gate 102. The output of the NAND gate provides an enable (EN) that controls whether or not the local clock buffer 104 is enabled to clock each sequential with a clock signal (Clki) generated from a clock signal (CLK) provided to the LCB driver 104.

In operation, if the input and output data for each sequential are the same, indicating that the sequential is not going to transition its output data value, then the Clki is disengaged by the LCB 104. On the other hand, if an input/output data pair from one or more sequentials are different, then the Clki is enabled, and the entire cluster of sequentials are clocked, at least for that cycle.

The override signal can activate the LCB to enable the sequential clocks (Clki) regardless of the data values at their input/output pairs. It may be useful, for example, if a manufactured chip has timing characteristics that are too tight for reliable operation.

The cluster in the depicted embodiment may comprise 10-20 sequential elements, but any number could be used. The single clock driver (LCB 104) distributes the local clock to these elements.

The areas of circuitry which may have the highest benefit from using STG will typically be those with free running clocks and without a significant number of logic stages between sequential elements. Due to the additional logic introduced with STG, areas of a design with reasonable timing margin are preferred. In addition, design areas which include clock networks with higher capacitive loading and therefore larger clock drivers have the potential to benefit the most from this system.

An example of a suitable application is clusters using radiation hardened sequential elements for the purpose of increased reliability. In these portions of a design, the total power is typically dominated by the clock distribution network because of the increased amount of clock loading associated with each radiation hardened device. A few additional factors may be considered in the process of selecting applications for utilizing STG. These factors include leakage power, cell utilization and routing congestion. Moreover, designs which allow for the use of low leakage devices and are dominated by dynamic power may make better candidates than designs which do not.

Utilizing low leakage devices reduces the additional leakage power incurred by the new logic associated with the STG system. In blocks where less dynamic power is generally dissipated than leakage power, STG may not return a sufficient benefit. In these cases the additional leakage power incurred may actually exceed the dynamic power saved. The additional logic also may increase the overall utilization of the block, and therefore blocks with a high utilization or significant routing congestion may also benefit less. The same may be true for a read pipeline as well as a number of other variations. STG can also be applied to numerous groupings of circuitry within synthesized blocks where many different sets of functionality are combined into a single block. Thus, as with almost any design, considerations weighing the benefits against the costs for implementing STG will likely be made on a design by design basis.

Figure 2:
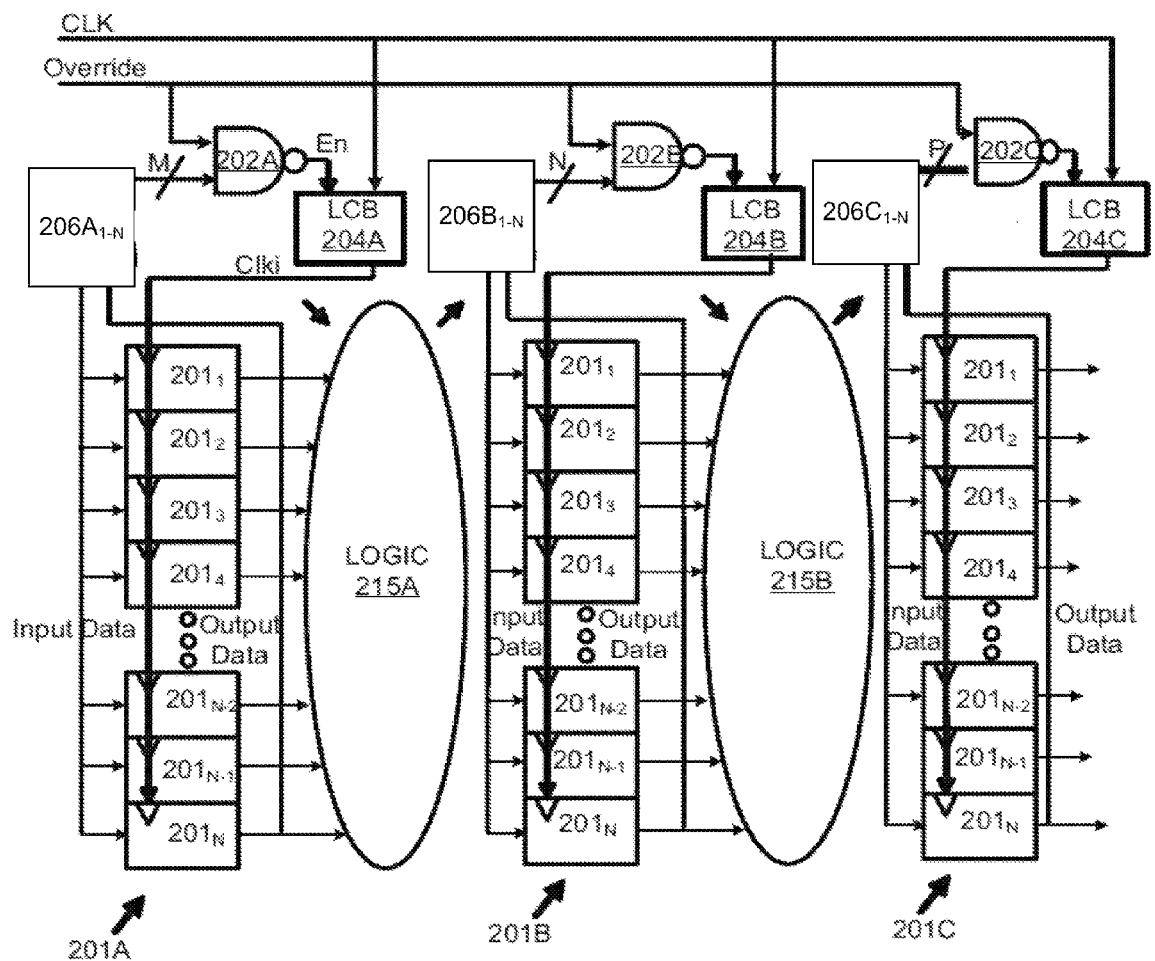
FIG. 2 is a schematic diagram of multiple logic circuits with state transition clock gating circuits linked together in accordance with some embodiments.

With reference to FIG. 2, a portion of an STG system comprising clusters 201A-C are shown. Each cluster has its own set of XNOR gates 206 (A-C), NAND gates 202 (A-C), and LCB buffers 204 (A-C), but the NAND gates and LCB buffers are driven by the same clock (CLK) and override signal. The clusters are cascaded together, as shown, with the outputs from a preceding logic block 215 (A-B) providing the inputs for the subsequent cluster. Again, it can be seen that STG enables and disables clocks on demand, separately for each cluster 201, resulting in minimal dynamic power dissipation during periods of low activity local to these elements.

The clusters may correspond to any suitable application. For example, some or all of the logic 215 could make up one or more register banks, e.g., with pipelined write data. With an STG implementation, portions of the clock network, even during stretches of cycles when write operations are being executed and data is traversing the pipeline, can be disengaged to save significant power over time. As another example, consider when the clusters are part of a memory array, which is being written constantly with values that are small, and therefore only the least significant bits are changing in a 32 or 64 bit data value. Conventional functional gating would require all the sequential elements staging this data to be enabled as long as the stage contains any relevant data at all. On the other hand, the STG system recognizes that the upper order bits continuously need to store 0's and therefore can stop the local clock network to that group of sequential elements for all but the first cycle. In turn, this can greatly reduce the amount of clock network toggling in such memory applications.

The override signal is distributed to each cluster of the STG system. In the depicted embodiment, it is set high to enable the system and set low to disable it. There typically may be one override control bit used among multiple sequential element clusters within a single functional block. As discussed above, for example, it may be used to allow for the system to be disabled in blocks where an unexpected speed path is identified, post silicon for example. Another possible use is during applications when the design is put into a low power mode, e.g., where the operating frequency is lowered. On the other hand, when the frequency is lowered, STG might be enabled when it otherwise may have not been, for example, if it was not possible to enable it at higher frequencies due to critical timing paths.

Figure 3:
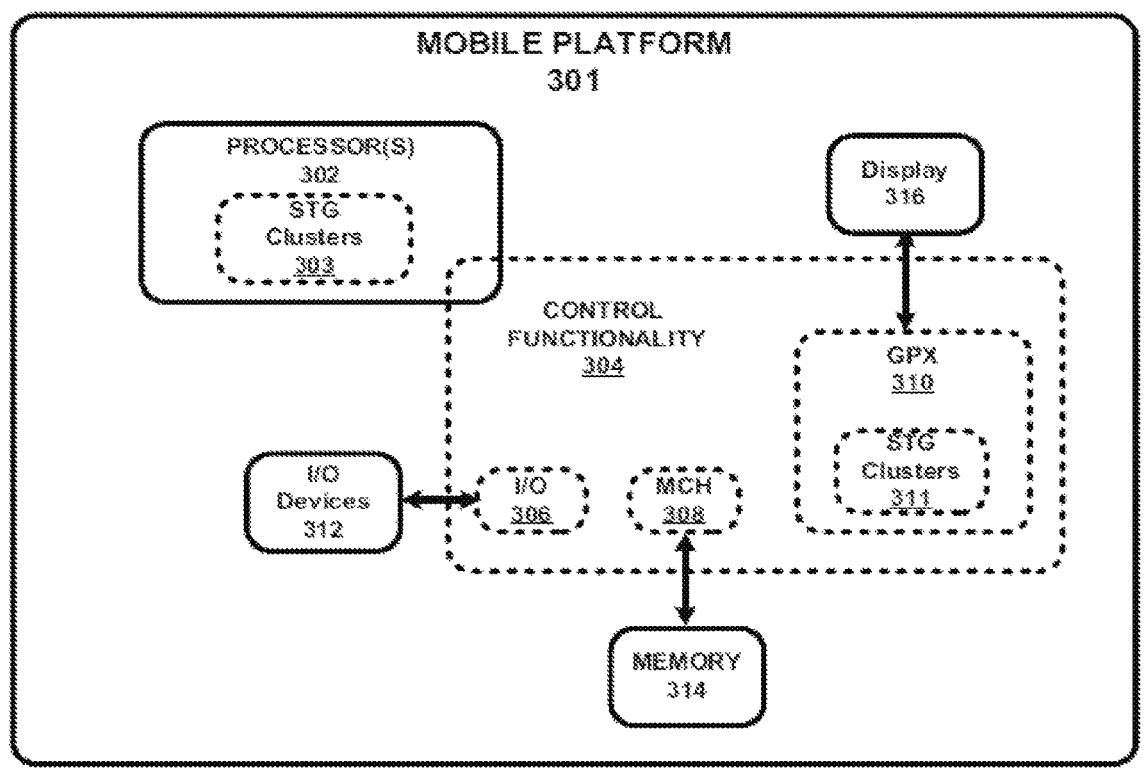
FIG. 3 is a block diagram of a mobile computing platform with one or more state transition clock gating circuits in accordance with some embodiments.

With reference to FIG. 3, one example of a portion of a mobile platform 301 is shown. The represented portion comprises one or more processors/processor cores 302, control functionality 304, with I/O hub functionality 306, memory control hub functionality 308, a graphics processing unit (GPX) 310, I/O devices 312, memory 314, and a display 316, coupled together as shown.

The control functionality 304 may comprise one or more circuit blocks to perform various interface control functions (e.g., memory control (MCH 308)), graphics processing 310, I/O interface control 306, and the like. These circuits may be implemented on one or more separate chips and/or may be partially or wholly implemented as part of the processor chip 302, e.g., as may be the case with a system-on-chip (SOC) implementation. On the other hand, the separate control units, such as the GPX 310, could be part of a wholly separate chip or module.

The I/O devices 312 comprise one or more devices including but not limited to scanners, printers, cameras, bus interface ports, keyboards, flash drives, mousse, joysticks, etc. The I/O devices may be directly coupled to the I/O controller 306, or indirectly through one or more different busses such as through a PCI bus or the like. The I/O controller 306 may comprise multiple different interface control units, encompassing control units such as wireless interfaces, network interfaces, etc. The memory 314 may comprise any suitable memory including but not limited to random access memory (RAM), non-volatile memory such as solid-state hard drives, flash drives, etc. While the memory block is shown coupled to the MCH functionality, it may also, or instead of, be coupled through the I/O control functionality 306. The display may constitute one ore more displays, such as an LCD display, for providing visual information to a user.

The processor, in its one or more cores, comprises STG clusters 303 of sequentials providing data to registers, memory arrays, and/or other units using sequentials. Similarly, the GPX 310 may also comprise one or more STG clusters 311 of sequentials. Even though not depicted, STG clusters could alternatively or additionally be implemented in memory 314 and/or in other parts of the control functionality.

The mobile platform 301 may implement a variety of different computing devices or other appliances with computing capability. Such devices include but are not limited to laptop computers, notebook computers, personal digital assistant devices (PDAs), cellular phones, audio and/or or video media players, and the like. It could constitute one or more complete computing systems or alternatively, it could constitute one or more components useful within a computing system.

In the preceding description, numerous specific details have been set forth. However, it is understood that embodiments of the invention may be practiced without these specific details. In other instances, well-known circuits, structures and techniques may have not been shown in detail in order not to obscure an understanding of the description. With this in mind, references to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the preceding description and following claims, the following terms should be construed as follows: The terms "coupled" and "connected," along with their derivatives, may be used. It should be understood that these terms are not intended as synonyms for each other. Rather, in particular embodiments, "connected" is used to indicate that two or more elements are in direct physical or electrical contact with each other. "Coupled" is used to indicate that two or more elements co-operate or interact with each other, but they may or may not be in direct physical or electrical contact.

The invention is not limited to the embodiments described, but can be practiced with modification and alteration within the spirit and scope of the appended claims. For example, it should be appreciated that the present invention is applicable for use with all types of semiconductor integrated circuit ("IC") chips. Examples of these IC chips include but are not limited to processors, controllers, chip set components, programmable logic arrays (PLA), memory chips, network chips, and the like.

It should also be appreciated that in some of the drawings, signal conductor lines are represented with lines. Some may be thicker, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

It should be appreciated that example sizes/models/values/ranges may have been given, although the present invention is not limited to the same. As manufacturing techniques (e.g., photolithography) mature over time, it is expected that devices of smaller size could be manufactured. In addition, well known power/ground connections to IC chips and other components may or may not be shown within the FIGS, for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits) are set forth in order to describe example embodiments of the invention, it should be apparent to one skilled in the art that the invention can be practiced without, or with variation of, these specific details. The description is thus to be regarded as illustrative instead of limiting.

What is claimed is:

1. An integrated circuit (IC) comprising:
    a clock distribution network for distributing a clock signal;
    a first sequential circuit having a clock input to receive the clock signal to generate an output, the output of the first sequential circuit coupled to an input of a first logic group comprising combinatorial logic circuitry; and
    first circuitry to compare logic states of the input and the output and to inhibit the clock signal from propagating to the clock input if the logic states are the same;
    a second sequential circuit having a second clock input to receive the clock signal to generate a second output, the second output of the second sequential circuit coupled to an input of a second logic group comprising combinatorial logic circuitry; and
    second circuitry to compare logic states of the input and the output of the second sequential circuit and to inhibit the clock signal from propagating to the second sequential circuit if the logic states are the same.

2. The IC of claim 1 wherein the first and second circuitry further comprise a respective override input to receive an override signal to cause the first and second circuitry to provide the clock signal to the first and second clock inputs.

3. The IC of claim 1, wherein the clock distribution network is a local clock distribution network coupled to a global clock distribution network, the global clock distribution to provide the clock signal to the clock distribution network.

4. The IC of claim 1, wherein the first sequential circuit includes at least one of: a master-slave flip-flop; a latch.

5. The IC of claim 1, wherein the first circuitry comprises an Exclusive-NOR (XNOR) logic gate.

6. The IC of claim 5 wherein the first circuit further comprises:
    a NAND logic gate to receive an output of the XNOR logic gate; and
    a local clock buffer to receive an output of the NAND logic gate, the local clock buffer to provide the clock signal to the first sequential circuit according to an output of the NAND logic gate.

7. The IC of claim 6, wherein the NAND logic gate is coupled to receive an override signal to override the output of the NAND logic gate, and to cause the local clock buffer to provide the clock signal to the first sequential circuit.

8. An integrated circuit (IC) comprising:
    a clock distribution network for distributing a clock signal;
    a first local clock buffer coupled to receive the clock signal and to provide a first local clock signal to a first group of sequential circuits; and
    a first comparison circuit; having an output coupled to an input of the first local clock buffer, the first comparison circuit to compare respective input and outputs of the first group of sequential circuits, the first local clock buffer to gate the first local clock signal from propagating to the first group of sequential circuits if the respective inputs and outputs of the first group of sequential circuits are the same;
    a second local clock buffer coupled to receive the clock signal and to provide a second local clock signal to a second group of sequential circuits; and
    a second comparison circuit having an output coupled to an input of the second local clock buffer, the second comparison circuit to compare respective input and outputs of the second group of sequential circuits, the second local clock buffer to gate the second local clock signal from propagating to the second group of sequential circuits if the respective inputs and outputs of the second group of sequential circuits are the same.

9. The IC of claim 8 further comprising a signal line to transport an override signal to cause the first local clock buffer to provide the first local clock signal to the first group of sequential circuits regardless of the comparing by the first logic unit.

10. The IC of claim 8, wherein the clock distribution network is a local clock distribution network coupled to a global clock distribution network, the global clock distribution to provide the clock signal to the clock distribution network.

11. The IC of claim 8, wherein the first and second comparison circuits comprise an Exclusive-NOR (XNOR) logic gate.

12. A system comprising:
    a memory unit; and
    a processor, coupled to the memory unit, the processor having one or more processing cores, wherein each processing core comprises:
    a clock distribution network for distributing a clock signal;
    a first sequential circuit having a clock input to receive the clock signal to generate an output, the output of the first sequential circuit coupled to an input of a first logic group comprising combinatorial logic circuitry; and
    first circuitry to compare logic states of the input and the output and to inhibit the clock signal from propagating to the clock input if the logic states are the same;

a second sequential circuit having a second clock input to receive the clock signal to generate a second output, the second output of the second sequential circuit coupled to an input of a second logic group comprising combinatorial logic circuitry; and second circuitry to compare logic states of the input and the output of the second sequential circuit and to inhibit the clock signal from propagating to the second sequential circuit if the logic states are the same.

13. The system of claim 12 further comprises a display unit.

14. The system of claim 12, wherein the memory unit and the processor are part of a system-on-chip (SOC).

15. The system of claim 12 further comprises a second logic unit to receive output of the sequential logic unit.

16. The system of claim 12 further comprises a third logic unit to receive an override signal to cause the first logic unit to provide the clock signal to the clock distribution network regardless of the comparing by the first logic unit.

* * * * *